(12) United States Patent
Van Der Toorn

(10) Patent No.: US 7,070,178 B2
(45) Date of Patent: Jul. 4, 2006

(54) HOLDER FOR A SUBSTRATE CASSETTE AND DEVICE PROVIDED WITH SUCH A HOLDER

(75) Inventor: Karel-Jan Van Der Toorn, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/882,081

(22) Filed: Jun. 15, 2001

(65) Prior Publication Data

US 2002/0008345 A1 Jan. 24, 2002

(30) Foreign Application Priority Data

Jun. 15, 2000 (EP) .................................. 00202080

(51) Int. Cl.
*B23Q 3/00* (2006.01)
(52) U.S. Cl. .................................. 269/309; 269/289 R
(58) Field of Classification Search ................ 269/309, 269/307, 266, 43, 289 R, 241, 257–259, 269/261–262, 268, 282, 279, 285; 279/137, 279/152, 153
See application file for complete search history.

(56) References Cited

U.S. PATENT DOCUMENTS

| | | | | |
|---|---|---|---|---|
| 3,578,799 A | * | 5/1971 | Davis .......................... | 269/296 |
| 3,608,886 A | * | 9/1971 | Greene ....................... | 269/307 |
| 3,626,600 A | * | 12/1971 | Gaither ........................ | 269/309 |
| 4,732,373 A | * | 3/1988 | Yang ........................... | 269/241 |
| 5,060,920 A | * | 10/1991 | Engibarov ................... | 269/282 |
| 5,074,536 A | * | 12/1991 | McConkey ................... | 269/43 |
| 5,206,627 A | * | 4/1993 | Kato ........................... | 340/674 |
| 5,246,218 A | * | 9/1993 | Yap et al. .................... | 269/309 |
| 5,386,654 A | * | 2/1995 | Kroenke ...................... | 269/307 |
| 6,152,435 A | * | 11/2000 | Snell ............................ | 269/43 |
| 6,383,890 B1 | * | 5/2002 | Takisawa et al. ............. | 269/21 |
| 6,884,639 B1 | * | 4/2005 | Dougan et al. ............... | 438/14 |
| 2002/0008345 A1 | * | 1/2002 | Van Der Toorn ........... | 269/309 |

* cited by examiner

*Primary Examiner*—Lee D. Wilson
(74) *Attorney, Agent, or Firm*—Peter Zawilski

(57) ABSTRACT

A holder is disclosed for a cassette for substrates. The holder includes a base plate on which a guide member provided with at least two guides is secured. The cassette is to be positioned between the guides, which enable the cassette to be aligned with respect to the base plate, and the side of which facing the base plate tapers inwards and downwards. The application of such a holder in an apparatus for manufacturing semiconductor devices is still hampered as a result of incorrectly positioning the holder in the apparatus. This can lead to damage to the substrates and a lower yield of the manufacturing process. The side of the guide member tapers inwards and upwards. By virtue of this structure, the cassette can be positioned more accurately and reproducibly into the holder. In this way, damage to substrates is avoided and the yield is high. The guide member may be mirror symmetrical and can include two separate guide members, which are mirror symmetrical as well. As a result, the holder can be mounted, adjusted and manufactured in a simple and inexpensive manner.

7 Claims, 2 Drawing Sheets

HOLDER FOR A SUBSTRATE CASSETTE AND DEVICE PROVIDED WITH SUCH A HOLDER

FIELD OF THE INVENTION

The invention relates to a holder for a cassette for substrates, comprising a base plate on which a guide member provided with at least two guides is secured, which cassette can be arranged between the guides, which enable the cassette to be aligned with respect to the base plate, and the side of which facing away from the base plate is embodied so as to taper inwards.

BACKGROUND OF THE INVENTION

Such a holder is employed in a lot of equipment used in the manufacture of discrete and integrated semiconductor products. The invention thus also relates to an apparatus provided with such a holder.

A holder of the type mentioned in the opening paragraph is known from U.S. Pat. No. 5,246,218, published on Sep. 21, 1993. In said specification, a description is given of a holder for a substrate cassette, which comprises a base plate on which a guide member is secured, which guide member includes two separate, mutually parallel guides. The cassette holder can be alignably arranged between the guides whose upper side, adjoining the cassette, tapers downwards. As a result of this guide profile with aligning effect, it is easier to accurately arrange the cassette between the guides. After the cassette has been arranged between the guides, the substrates are removed from the cassette, treated and placed back by a robot which forms part of an apparatus comprising the holder. For this purpose, the holder is coupled to a lift mechanism. This enables the substrates to be placed in or removed from the cassette one by one and at the same height. After all substrates have been treated, the cassette is transferred to another apparatus comprising similar features for a subsequent treatment.

A drawback of the known holder resides in that the cassette is not always identically located, or identically aligned, in the holder. As a result, introducing the substrates into the cassette or removing them from the cassette is hampered, which may cause damage to the substrates. Also damage to the cassette or equipment is possible.

BRIEF SUMMARY OF THE INVENTION

Therefore, it is an object of the invention to provide a holder wherein a substrate cassette is always identically situated and properly aligned. In addition, (de)mounting of the holder should be easy and, first and foremost, its manufacture should be easy and economical.

To achieve this, a holder of the type mentioned in the opening paragraph is characterized in accordance with the invention in that the side of the guides facing the base plate also tapers inwards. It is thus achieved that the part of the holder that is situated closest to the cassette only has a comparatively limited height and, first and foremost, adjoins the cassette at some distance above the base plate. By virtue thereof, particularly the risk of tilting and/or leaning over of the cassette after it has been arranged between the guides is reduced. The part of the guides situated closest to the cassette can additionally be situated at a comparatively small distance from the cassette, for example at a distance of only one millimeter. By virtue thereof, the cassette can be arranged on and aligned with respect to the base plate in a very accurate manner, while the cassette can still be very readily introduced into the holder, which is an important advantage, even when the cassette approaches the holder from a different direction with respect to the position after it has been arranged.

In a preferred embodiment, the side facing the base plate is mirror symmetrical with respect to the side facing away from the base plate. This has a number of important advantages. First of all, the way in which the guide member is provided on the base plate is less important now. The reason for this being that the upper side is equal to the lower side. Besides, also the manufacture of the guide member is simplified by virtue of this symmetry. All this applies, in particular, if the guide member is formed, like in the known holder, from two individual parts, which are also mirror symmetrical, and which each comprise at least one guide. Preferably, the guides demonstrate, viewed in cross-section, a trapezoidal, inwardly directed profile. This enables the advantages of the invention to be optimized in a simple manner.

In a particularly favorable modification, the guide member and the base plate are provided with corresponding openings having the shape of an elongated slot, the longitudinal directions of which are substantially mutually perpendicular, and by means of which the guide member is detachably secured to the base plate by means of bolts and nuts. By virtue thereof, the desired position of the holder can be readily adjusted when the guide member is secured to the base plate. Also any necessary intermediate adaptation of the position can be readily carried out. In this connection, the base plate is preferably graduated at the location of two mutually perpendicular outer sides of the guide member. By virtue thereof, it is easier to accurately and reproducibly secure the guide member to the base plate. The bolts and nuts are preferably embodied so that the bolt can be loosened as far as a detachable stop. By virtue thereof, on the one hand, complete demounting is possible and, on the other hand, it is precluded that in the case of an intermediate adaptation of the position, the bolts and/or nuts become completely undone, thereby causing damage to the device.

The guide member of the holder preferably comprises two mirror-symmetrical guide members, which each form at least one, and preferably three, guides which each adjoin a single side of the cassette. In fact, the holder thus comprises only a single type of guide member. As a result, both the assembly and the manufacture of the holder are further simplified. To enable the cassette to be readily arranged in the holder, the guide member is preferably made of a material having a low coefficient of friction. A particularly suitable material is a high-molecular polyethene. This material can also readily be cleaned and enables the guide member to be manufactured in a simple and economical manner.

A device for the manufacture of semiconductor products in accordance with the invention is provided with a holder in accordance with the invention. Such a device enables products to be manufactured in large numbers and is easy to maintain. Preferably, such a device comprises detection means which signal that the cassette for the substrates is positioned between the guides. In the known device, such detection proved incapable of detecting every cassette that is improperly and inaccurately positioned. In a device in accordance with the invention, wherein the cassette is substantially perfectly positioned, detection is needed, and useful, only to preclude that the device is operated when there is no cassette in the device.

In addition to the parts necessary for processing the (semiconductor) substrates, the device preferably comprises means for arranging the cassette in the holder or removing the cassette from the holder, further means for adjusting the holder for height, and other means for arranging substrates in the cassette or removing substrates from the cassette.

These and other aspects of the invention will be apparent from and elucidated with reference to the embodiment(s) described hereinafter.

BRIEF DESCRIPTION OF THE DRAWINGS

In the drawings.

The Figures are not drawn to scale, and particularly the dimensions in the thickness direction are exaggerated for clarity. Corresponding areas bear the same reference numerals whenever possible.

DETAILED DESCRIPTION

Figure 1:
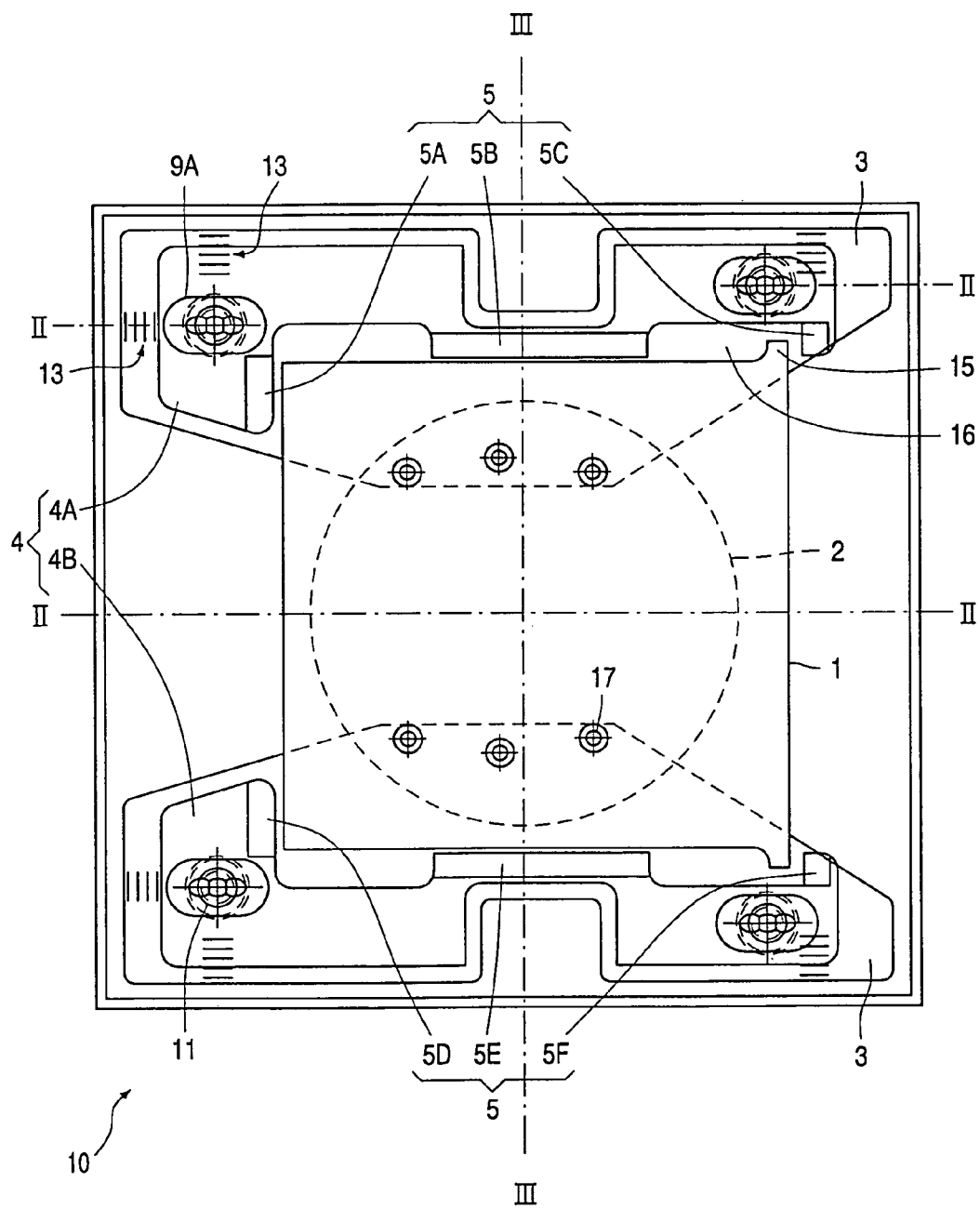
FIG. 1 is a diagrammatic plan view of an embodiment of a holder in accordance with the invention provided with a cassette with substrates.
Figure 2:
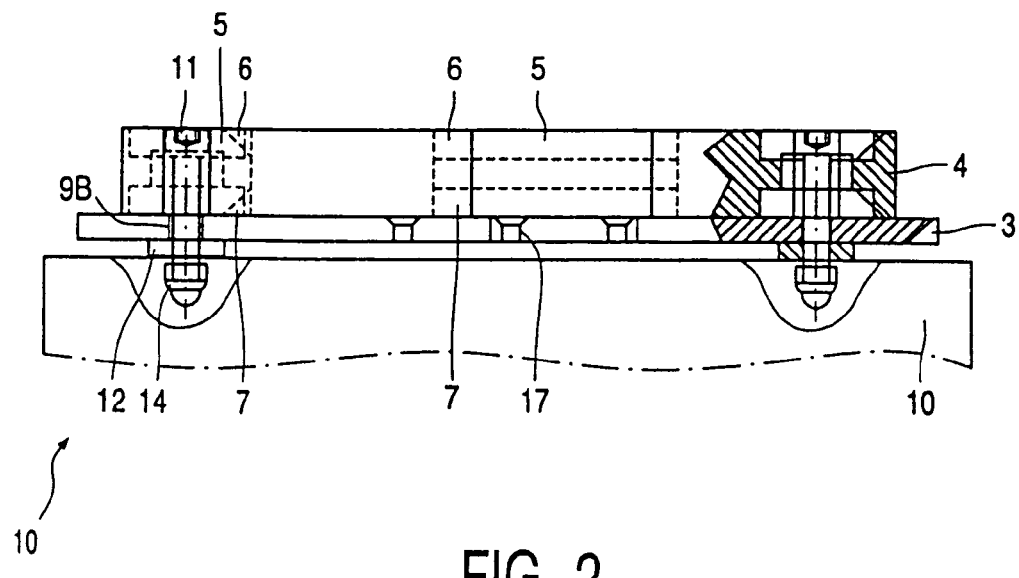
FIG. 2 is a diagrammatic, cross-sectional view, at right angles to the plane of the drawing, and taken on the line II—II, of the holder shown in FIG. 1.
Figure 3:
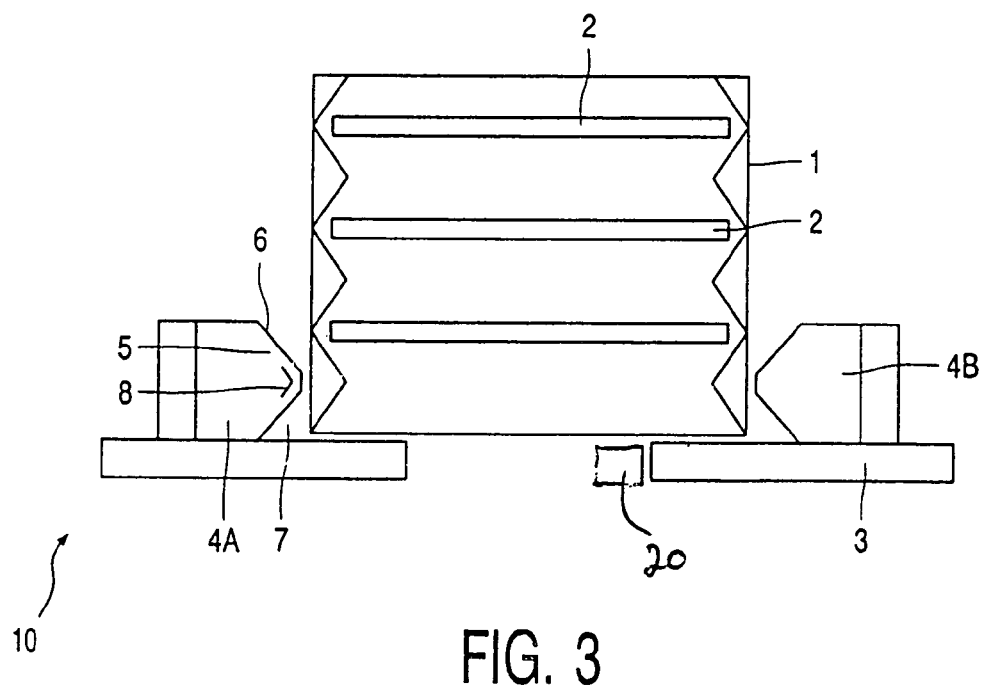
FIG. 3 is a diagrammatic, cross-sectional view, at right angles to the plane of the drawing, and taken on the line III—III, of the holder shown in FIG. 1.

FIG. 1 is a diagrammatic plan view of an embodiment of a holder provided with a cassette with substrates in accordance with the invention. FIGS. 2 and 3 are diagrammatic, cross-sectional views, at right angles to the plane of the drawing, and taken on the lines II—II and III—III, respectively, of the holder shown in FIG. 1. The holder 10 comprises a base plate 3 which, in this case, is composed of two portions 3, on which a guide member 4, composed, in this case, of two guide members 4A, 4B, is secured. The guide members 4A, 4B each comprise a guide 5, in this case three guides 5A, 5B, 5C and 5D, 5E, 5F, respectively, each adjoining a cassette 1 with substrates 2 on at least one side, i.e. in this example on three sides. The side 6 of the guide member 4 facing away from the base plate 3, see FIG. 2 or 3, is embodied so as to taper inwards. By virtue thereof, the cassette 1 can be more readily positioned in the holder 10.

In accordance with the invention, also the side 7 of the guide member 3 facing the base plate 1 is embodied so as to taper inwards. As a result, the part of the guide 5 situated closest to the cassette 1 is at some distance from the base plate 3. By virtue thereof, on the one hand, the smallest distance between the guide 5 and the cassette 1 can be very small, for example approximately 1 mm, which enables the cassette 1 to be very accurately positioned, while, on the other hand, the cassette 1 can still be very readily positioned in the holder 10. Due to this construction, in particular, the risk that the cassette 1 is obliquely positioned in the holder 10, i.e. tilted with respect to the base plate 3, is very small. If the cassette 1 is improperly positioned, a sensor, which is connected to the device but not shown in the drawing, will not be activated. By virtue of all the above aspects, the risk that the cassette 1 is improperly positioned, for example with respect to moving parts of an apparatus, not shown in the drawing, of which the holder 10 forms part, is very small. Such an apparatus is, for example, an apparatus which is customarily used in the manufacture of semiconductor products, such as an etch apparatus or photoresist apparatus. By virtue of said accurate positioning, the risk of damage to the cassette 1 and, in particular, to the substrates 2 is very small. Consequently, in the manufacture of semiconductor products comprising a holder 10 in accordance with the invention, such as ICs (=Integrated Circuits), the percentage of rejects is low, leading to a substantial reduction of the cost price.

In this example, see FIG. 3, the profile 8 of the parts of the guides 5 adjoining the cassette 1 are trapezoidal in shape. This profile 8 can be readily produced and the desired properties can be readily optimized. Both guide members 4 are secured to the base plate parts 3 by means of bolts 11 and nuts 12 situated in corresponding openings in said parts 4, 3, which openings are each slot-shaped with mutually perpendicular longitudinal directions. By virtue thereof, the guide member 4 to be connected, here the guide members 4A, 4B, can be readily moved in all directions with a view to positioning the cassette 1 in the desired, ultimate position. The end portions of the bolts 11 are provided, in this example, with a stop nut 14 enabling the guide member 4 to be safely loosened for (intermediate) repositioning, i.e. without parts of the holder 10 falling to the ground or into the apparatus. (Re)positioning of the guide member 4 is substantially facilitated by graduation strokes 13 provided on the base plate 3.

An important additional advantage of a holder 10 in accordance with the invention resides in that the holder, and particularly the guide member 4, can be readily manufactured by virtue of the symmetry between the upper face 6 and the lower face 7. It is also easier to use because the guide member 4 can be placed on the plate 3 in the inverted position. This applies even more for this example wherein the guide member 4 is composed of two individual, yet mirror-symmetrical guide members 4A, 4B. Also a left-right interchange, if necessary in conjunction with a top-bottom interchange, is possible now. The manufacture of both guide members 4A, 4B is actually identical to the manufacture of a single type of guide member 4 and can be carried out by means of a computer-controlled milling machine.

In this case, the guide members 4A, 4B are made from a high-molecular polyethene, which is a material having a low coefficient of friction as well as other favorable properties, such as a good processability. In addition, the material is stable with respect to isopropanol or isopropanone, so that it can be properly cleaned by means of said substances. In this example, the dimensions of the holder 10 are adapted to the dimensions of the cassette 1, which is a box-shaped body 1, one side of which is open and one side face of which is provided with a projection 15, the dimensions of which are determined by the number and the diameter, for example 8 inches, of the substrates 2 to be arranged therein. The height dimension of the guide members 4A, 4B is 25 mm in this example, the height dimension of the part thereof extending parallel to the cassette 1 is approximately 12 mm in this example. The width and the height of the facets 6, 7 is approximately 7 mm. These dimensions are also tailored so as to obtain a satisfactory operation of the above-mentioned position-sensor. In this example, recesses 16 in the guide members 4A, 4B are situated between the guides 5. The base plate 3 has a thickness of 5 mm, in this example, and is made of anodized aluminum provided with holes 17 to secure the base plate to the apparatus of which the holder 10 forms part. The materials, polyethene and aluminum, used for the holder have the important additional advantage that, during operation, no metal or dust particles are formed which are detrimental to a production process of, for example, ICs.

For further particularities regarding an apparatus of which the holder 10 of this example forms part, reference is made to the opening paragraphs and to the United States patent specification mentioned therein.

The invention is not limited to the embodiment described herein, and, within the scope of the invention, many variations and modifications are possible to those skilled in the art. For example, the dimensions of the holder and the constituent parts thereof may be chosen to be different in view of a different standard diameter of the substrates. Moreover, the holder can be made of other materials, such as teflon. Apart from ICs, also discrete semiconductor products can be manufactured by means of a holder in accordance with the invention.

It is explicitly noted that the application of the holder is not limited to a (plasma) etch apparatus. A holder in accordance with the invention can also advantageously be used in other processing apparatus such as a photoresist apparatus, an epitaxy, diffusion or ion implantation apparatus etc.

It is further noted that, by virtue of this invention, the cassette holder can be readily moved in all directions, i.e. the X, Y and Z direction.

The invention claimed is:

1. A cassette holder arrangement, the holder arrangement comprising:
   a cassette to hold at least one semiconductor material substrate;
   a base plate; and
   a guide member located over and supported by the base plate, the guide member having cassette-directed guides for aligning the cassette along substantially perpendicular axes over the base plate, each cassette-directed guide having a respective end portion protruding to secure the cassette with respect to the base plate upon introduction to the holder arrangement,
   wherein the respective end portion of each guide has a first side of the guide member which is facing away from the base plate and a second side of the guide member facing toward the base plate, the first and second sides tapered toward one another in a direction toward the protruding end portion so as to form the respective protruding end portion, and arranged at a predetermined distance from the cassette so as to accurately hold the cassette in alignment on the base plate within the predetermined distance of the guides from the cassette; and wherein, viewed in cross-section, the guides demonstrate a trapezoidal, inwardly directed profile.

2. The holder arrangement as claimed in claim 1, wherein the second side facing the base plate is mirror symmetrical with respect to the first side facing away from the base plate.

3. The holder arrangement as claimed in claim 1, wherein the guide member includes at least three cassette-directed guides wherein two of the guides oppose each other from opposite ends of the guide member and the third is located along the length of the guide member.

4. The holder arrangement as claimed in claim 3, wherein the guide member is detachably secured to the base plate by means of bolts and nuts and wherein the base plate is graduated at a location of two mutually perpendicular outer sides of the guide member.

5. The holder arrangement as claimed in claim 4, wherein the base plate, the bolts and the nuts are made of aluminum.

6. The holder arrangement as claimed in claim 1, further including a second guide member constructed and arranged opposite and identical to the first guide member to mirror the first guide member.

7. The holder arrangement as claimed in claim 1, wherein the guide member is made from a polyethylene material having a low coefficient of friction.

* * * * *